US007554343B2

(12) United States Patent
Bromfield

(10) Patent No.: US 7,554,343 B2
(45) Date of Patent: Jun. 30, 2009

(54) ULTRASONIC TRANSDUCER CONTROL METHOD AND SYSTEM

(75) Inventor: George Bromfield, Salt Lake City, UT (US)

(73) Assignee: PiezoInnovations, Salt Lake City, UT (US)

(*) Notice: Subject to any disclaimer, the term of this patent is extended or adjusted under 35 U.S.C. 154(b) by 114 days.

(21) Appl. No.: 11/492,172

(22) Filed: Jul. 24, 2006

(65) Prior Publication Data

US 2007/0035203 A1 Feb. 15, 2007

Related U.S. Application Data

(60) Provisional application No. 60/702,186, filed on Jul. 25, 2005.

(51) Int. Cl.
*G01R 27/08* (2006.01)
*H02N 2/00* (2006.01)

(52) U.S. Cl. .................................. 324/713; 310/316.01

(58) Field of Classification Search ................. 324/713, 324/691, 649, 600; 310/311, 316.01, 319; 73/1.15, 1.48

See application file for complete search history.

(56) References Cited

U.S. PATENT DOCUMENTS

| | | | | |
|---|---|---|---|---|
| 3,432,691 | A | 3/1969 | Shoh | |
| 3,443,130 | A | 5/1969 | Shoh | |
| 3,980,905 | A | 9/1976 | Miller | |
| 3,988,541 | A | 10/1976 | Boast | |
| 4,227,110 | A * | 10/1980 | Douglas et al. | 310/316.01 |
| 4,649,565 | A | 3/1987 | Kaizer et al. | |
| 4,973,876 | A * | 11/1990 | Roberts | 310/316.01 |
| 5,431,664 | A | 7/1995 | Ureche et al. | |
| 5,596,311 | A * | 1/1997 | Bess et al. | 340/384.7 |
| 5,684,243 | A | 11/1997 | Gururaga et al. | |
| 6,203,516 | B1 | 3/2001 | Kepley | |
| 6,678,621 | B2 | 1/2004 | Wiener et al. | |
| 6,698,269 | B2 | 3/2004 | Baber et al. | |
| 7,203,612 | B2 * | 4/2007 | Kobe et al. | 702/75 |
| 2004/0190733 | A1 | 9/2004 | Nayar et al. | |

FOREIGN PATENT DOCUMENTS

| | | |
|---|---|---|
| GB | 145691 | 7/1921 |
| GB | 868784 | 5/1961 |
| WO | WO98/26262 | 6/1998 |

OTHER PUBLICATIONS

PCT International Search Report, PCT/US06/28750, Feb. 22, 2007.

* cited by examiner

*Primary Examiner*—Vincent Q Nguyen
*Assistant Examiner*—Hoai-An D Nguyen
(74) *Attorney, Agent, or Firm*—Elaine C. Stracker

(57) ABSTRACT

The present invention relates to methods for velocity control of transducers that can compensate both for age related changes as well as the more immediate changes that occur during operation. In one aspect of the invention, the non-motional reactive current is measured at two predetermined frequencies, one below ($I_{lf}$) and one above the resonance frequency ($I_{hf}$). A correction factor is calculated from these measured currents is used to maintain a specified value of end effector velocity or displacement. In another aspect of the invention, methods are provided for the detection of secondary resonances that could be indicative of end effector fault conditions. In another aspect of the invention, velocity control is achieved.

15 Claims, 12 Drawing Sheets

ULTRASONIC TRANSDUCER CONTROL METHOD AND SYSTEM

CROSS REFERENCE TO RELATED APPLICATIONS

This application claims priority under 35 U.S.C. §119 from Provisional Application Ser. No. 60/702,186, filed Jul. 25, 2005, the disclosure of which is incorporated herein by reference.

FIELD OF THE INVENTION

The invention relates generally to the field of transducers. More specifically, the invention relates to a method of achieving improved velocity control for piezoelectric sonar and ultrasonic transducers.

BACKGROUND

The application of velocity control to transmitting piezoelectric transducers is extremely difficult because of the inherent instability of piezoelectric materials. The properties of these materials change in a complex manner when under the influence of time, temperature and pressure. When assembled into a transducer, there is additional variability associated with components that can cause localized heating in the joints between the piezo elements. Velocity control can be used to improve the performance of transducers that are used in a variety of applications, including high power medical applications (such as, cataract fragmentation, kidney stone fragmentation, liposuction, suture welding, and thrombi ablation), and dental, industrial cleaning, and sonar applications. Transducers used for high power medical applications are usually referred to as handpieces.

Sonar transducers are usually assembled into a multi-element array in order to improve or modify the directional response of a single transducer. Variations in the piezo properties of individual transducers within an array can result in variations in the relationship between drive current and the velocity of the radiating surface. The directional response of a single transducer and an array of transducers are characterized by the formation of a beam in a preferred direction and a number of lower intensity side lobes. An array of transducers can be mechanically steered to a preferred direction or it can be electrically steered by applying phase or time delays to the individual transducers.

When the array of transducers is driven at high power, the piezo material within the transducers in the center of the array will increase in temperature to a greater degree than those disposed around the outside of the array. Therefore under long-term operation the effective coupling coefficient, k, of the transducers in an array will be reduced in a non-uniform manner that will increase the level of the side lobes and degrade the directional performance of the array. Also, there is a variation in the effective coupling coefficient of sonar transducers that is associated with manufacturing tolerances.

There is therefore a need in the art to apply velocity control in a manner that will compensate for variation in the effective coupling coefficient of the transducers within an array. By applying velocity control to the individual transducers within the array, the level of the side lobe intensities can be reduced and thus improve the directional discrimination of the main beam. The side lobe level can be reduced to very low levels by a technique known as amplitude shading whereby the velocity of individual transducers in the region of the center of the array are greater than those of transducers located at the edge of the array.

The need for effective or enhanced velocity control is most acute for high power endoscopic medical procedures where the precise control of cutting, fragmentation or stress-generated heat is critical. It is therefore important that a power level setting on the handpiece control instrument corresponds with a specific value of end effector velocity. For procedures where the operative site can be directly viewed, such as cataract fragmentation and teeth cleaning, velocity control is achieved by a variable foot peddle and automatic human feedback. However, these handpieces need to be automatically characterized at high power prior to use and the velocity needs to be controlled during this tune cycle. The prior art ultrasonic generator systems have little flexibility with regard to amplitude control because of unpredictable changes in the handpiece electro-mechanical characteristics caused by component tolerances, assembly method, and environmental conditions. These changes primarily result in variations in the stored electrical energy within the transducer. Therefore, the effective coupling coefficient, k, will change since this parameter is defined as the square root of the ratio of the mechanical stored energy to the total input energy. The impedance at resonance is inversely proportional to the effective coupling of the transducer. Thus, for a constant value of current, increasing the value of the coupling coefficient will result in less radiated and/or dissipated power and reduced tip/end effector displacement. Conversely, a reduction in the value of the coupling coefficient will result in higher impedance at resonance and increased power, voltage, and tip displacement. As most transducer control systems assume a linear relationship between current and tip velocity, decreases in the value of the effective coupling coefficient can result in high operational voltage and tensile failure in highly stressed components. These failures are most likely to occur during the tune cycle prior to actual use where the control system typically characterizes the handpiece at a higher power level.

U.S. Pat. No. 6,678,621 to Wiener, et al. describes a method of output displacement control using phase margin in an ultrasonic scalpel handpiece. Prior to operational use, an ultrasonic surgical handpiece is calibrated by causing it to be driven with an output displacement that is correlated with the phase margin, which is the difference of the resonant frequency and the anti-resonant frequency of the handpiece. A frequency sweep is conducted to find the resonant frequency and the anti-resonant frequency for the handpiece. The resonant frequency is measured at a point during the frequency sweep where the impedance of the handpiece is at its minimum. The anti-resonant frequency is measured at a point during the frequency sweep where the impedance of the handpiece is at its maximum. Using a target or specific output displacement, a drive current is calculated based on the phase margin. The handpiece is then controlled by the current output from a generator console to provide a given output displacement. To ensure these measurements are accurate and not effected by secondary resonances, the initial test data is stored in a micro-chip that is embedded within the transducer or the transducer connector. Complex adaptive control algorithms adjust the generator output current to maintain consistent velocity at the distal tip of the end effector.

Although simple in concept, this is a relatively complex method to implement as a practical system control algorithm, because it involves multiple measurements of impedance during the frequency sweep. It also involves a calculation based on the subsequent detection of both a maximum and minimum value of impedance. Typically, the number of measurements would be in the range of 100 to 5000 and would take a few seconds. Applying the method while a transducer is operating at full power would therefore result in an unacceptable interruption to the function of the end effector during the acquisition of impedance data.

Detecting secondary resonances, as shown in the measured data in FIG. 1, would also not be practical while the transducer is operational. For example, the frequency sweep data would need to be compared with the data stored in the microchip and this would take additional time. Secondary resonances are often caused by the attachment screw of the end effector. The application of ultrasonic energy tends to loosen the screw and this may not be detected during a calibration procedure prior to operational use.

There is therefore a general need in the art for a simplified method of controlling the transducer output current to achieve a desired value of end effector or radiating surface velocity that does not involve the use of an embedded micro-chip. There is also a need for a control method that can be implemented both prior to and during operational use and can be universally applied to both ultrasonic and sonar transducers.

SUMMARY

The present invention relates to methods for velocity control of transducers. Specifically, it relates to methods that can compensate both for age related changes in transducer characteristics as well as the more immediate changes that occur during operation.

In one aspect of this invention, a constant voltage is applied to the transducer and a non-motional characteristic, A, is measured or calculated at two predetermined frequencies, one below ($A_{lf}$) and one above the resonance frequency ($A_{hf}$). A correction factor is calculated from these characteristics. This factor, factor M is defined as the square root of $(A_{lf}-A_{hf})/(A_{lf}+A_{hf})$, and is proportional to the effective coupling coefficient of the transducer with the end effector attached. Characteristics that can be used to determine the correction factor, included, but are not limited to, current, impedance, admittance, susceptance, reactance, and capacitance. Preferably, the characteristic measured or calculated is proportional to a current measurement. Factor M can be measured at any number of pairs of different frequencies below and above resonance and the value of factor M can be averaged in order to improve accuracy. Incorporation of the correction factor into the transducer control system algorithm allows the transducer to maintain a specified value of end effector velocity or displacement.

In an embodiment of this aspect of the invention, a constant voltage is applied and maintained as the frequency is swept from below the resonance frequency to above the resonance frequency during the measurement of the characteristics, $A_{lf}$ and $A_{hf}$. Applying a constant voltage avoids the need to measure the voltage during the frequency sweep.

In another aspect of the invention, methods are provided for the detection of secondary resonances. These secondary resonances could be indicative of an end effector fault condition whereby the coupling threads loosen during operation. The secondary resonance detection method is based on measurements of phase angle between the applied voltage and current at frequencies below and above the resonance frequency. A significant component of motional current exists when the measured phase angle less that −89°. The presence of motional current in the normally clamped region of the frequency versus phase characteristic could be indicative of a secondary resonance or an unacceptable shift in the primary resonance frequency.

A third aspect of this invention relates to determining a correction factor for a system comprising a transducer coupled with a coupled horn. Attaching a horn to a transducer will reduce the effective coupling coefficient and the value of factor M. It is important that factor M is determined for a specific configuration of coupled transducer/horn/wave-guide/end effector that is representative of operational use to optimize performance of the configuration. Wave-guides are used to couple the end effector to the horn when the operative site is remote from the distal tip of the horn. A wave-guide comprises a member that is any number of half wavelength fractions long. Wavelength is calculated by dividing the longitudinal material sound velocity by the operational frequency.

Yet, another aspect of this invention comprises determining a correction factor when a tuning coil is electrically connected in parallel with an electrical connection to the transducer. Tuning coils are typically incorporated within the transducer control system. Their function is to compensate for the clamped capacitance of the transducer and reduce reactive power at the frequency of operation. Thus, the inclusion of a tuning coil will require a change in the calculation of factor M.

Yet another aspect of this invention is based on velocity control using power measurements and the design and application of a fixed controlled end effector load. One embodiment of this aspect involves a methodology for determining and applying a controlled fixed loading condition to the distal tip of end effectors used in a variety of surgical and dental applications. Another embodiment of this aspect is based on measurements of current at the resonance and anti-resonance frequencies. A further embodiment of this aspect is a methodology for velocity control based on a measurement of the current required to deliver a pre-determined value of power into a load that is attached to the distal tip of the transducer end effector.

Figure 1:
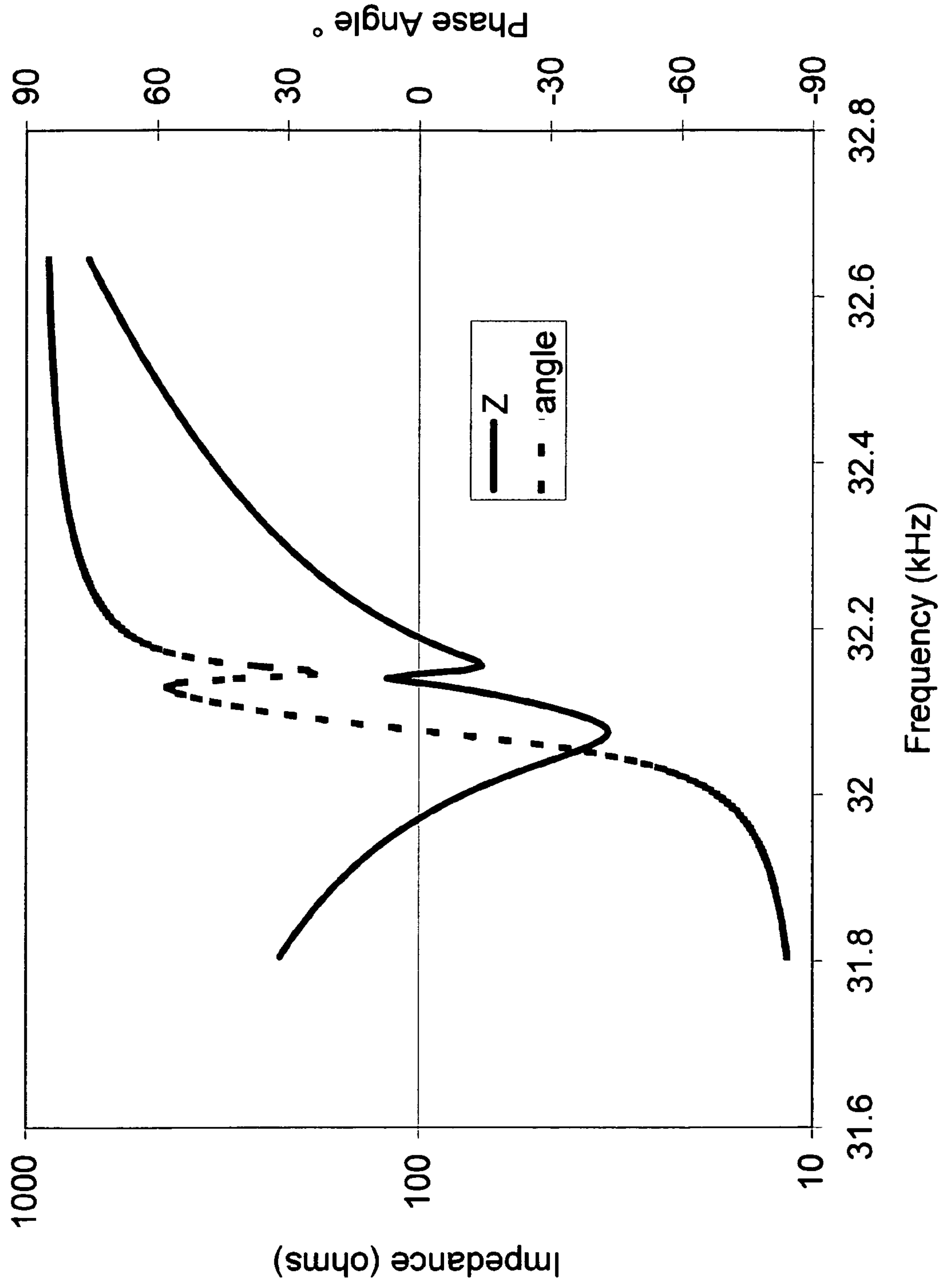
FIG. 1 is a graph of secondary resonances superimposed on the main longitudinal resonance of a transducer.

Reference will now be made in detail to embodiments of the present disclosure. While certain embodiments of the present disclosure will be described, it will be understood that it is not intended to limit the embodiments of the present disclosure to those described embodiments. To the contrary, reference to embodiments of the present disclosure is intended to cover alternatives, modifications, and equivalents as may be included within the spirit and scope of the embodiments of the present disclosure as defined by the appended claims.

DETAILED DESCRIPTION OF SPECIFIC EMBODIMENTS

Unless otherwise indicated, all numbers expressing quantities and conditions, and so forth used in the specification and claims are to be understood as being modified in all instances by the term "about."

In this application, the use of the singular includes the plural unless specifically stated otherwise. In this application, the use of "or" means "and/or" unless stated otherwise. Furthermore, the use of the term "including," as well as other forms, such as "includes" and "included," is not limiting. Also, terms such as "element" or "component" encompass both elements and components comprising one unit and elements and components that comprise more than one subunit unless specifically stated otherwise.

The section heading used herein are for organizational purposes only and are not to be construed as limiting the subject matter described. All documents, or portions of documents, cited in this application, including but not limited to patent, patent applications, articles, books, and treatises, are hereby expressly incorporated by reference in their entirety for any purpose.

CERTAIN DEFINITIONS AND TERMS

The terms "coupling coefficient" and "effective coupling coefficient" are used interchangeably throughout the specification.

The term "$k_{33}$" or "constant $k_{33}$" refers to the coupling coefficient of the piezo material.

The term "velocity control" means control of the movement of a device or a component of a device, wherein this movement is defined as $2\pi fd$, where f is the frequency and d is the peak-to-peak displacement of the device or the component of the device. For sonar transducers and ultrasonic cleaning transducers velocity control relates to the displacement of the radiating surface. Whereas, for dental and surgical ultrasonic transducers velocity control relates to the displacement at the tip of the end effector.

The term "coupled to" means to be attached to or connected to directly or indirectly or to be incorporated within.

The term "characteristic," as used herein with regard to "correction factor" or determining a "correction factor," refers to any calculable or measurable physical parameter or feature of an electric circuit. Examples include, but are not limited to, current, impedance, admittance, reactance, susceptance, and capacitance.

The term "correction factor" as used herein, is defined as the square root of $(A_{lf}-A_{hf})/(A_{lf}+A_{hf})$, wherein A is a measured or calculated characteristic at two predetermined frequencies, one below ($A_{lf}$) and one above the resonance frequency ($A_{hf}$). Depending on the characteristic measured or calculated, the A in the formula with be replaced with the value of that specific characteristic, for example, when current is measured the formula for determining the correction factor can be written as the square root of $(I_{lf}-I_{hf})/(I_{lf}+I_{hf})$. The term "correction factor" is used herein interchangeably with the terms "factor M" or "M factor."

The term "end effector" refers to any suitable device attached to the distal end of a horn coupled to the transducer, such as, for example, but not limitation, a needle, a scalpel, a blade, etc. used for accomplishing a specific task.

The terms "coupling coefficient" and "effective coupling coefficient" are used interchangeably throughout the specification.

CERTAIN EMBODIMENTS OF THE INVENTION

The transducer coupling coefficient can be interpreted in physical terms as the square root of the ratio of the mechanical stored energy to the total input energy. For transducers that operate primarily in a longitudinal mode of vibration, the effective coupling coefficient is related to the piezo material property $k_{33}$. Sandwich type ultrasonic transducers that primarily operate in a longitudinal mode of vibration are also called Langevin transducers. They are well known and used for the production of high intensity sonic and ultrasonic motion. As far back as 1921, in patent GB 145,69 J, the inventors disclosed a sandwich of piezoelectric material positioned between metal plates to produce high intensity ultrasound. Sandwich transducers utilizing a bolted stack transducer tuned to a resonant frequency and designed to the length of the half wavelength of the resonant frequency are described in GB 868,784. For sonar transducers and other half wavelength transducers that have a uniform and generally symmetrical end mass geometry, the measured value of the coupling coefficient is an important indicator of performance.

For half wavelength transducers used in sonar applications, the absolute value of coupling coefficient can be measured in air during the manufacture process. Achieving a high value of coupling coefficient is important because this results in a correspondingly wide frequency bandwidth.

Figure 2:
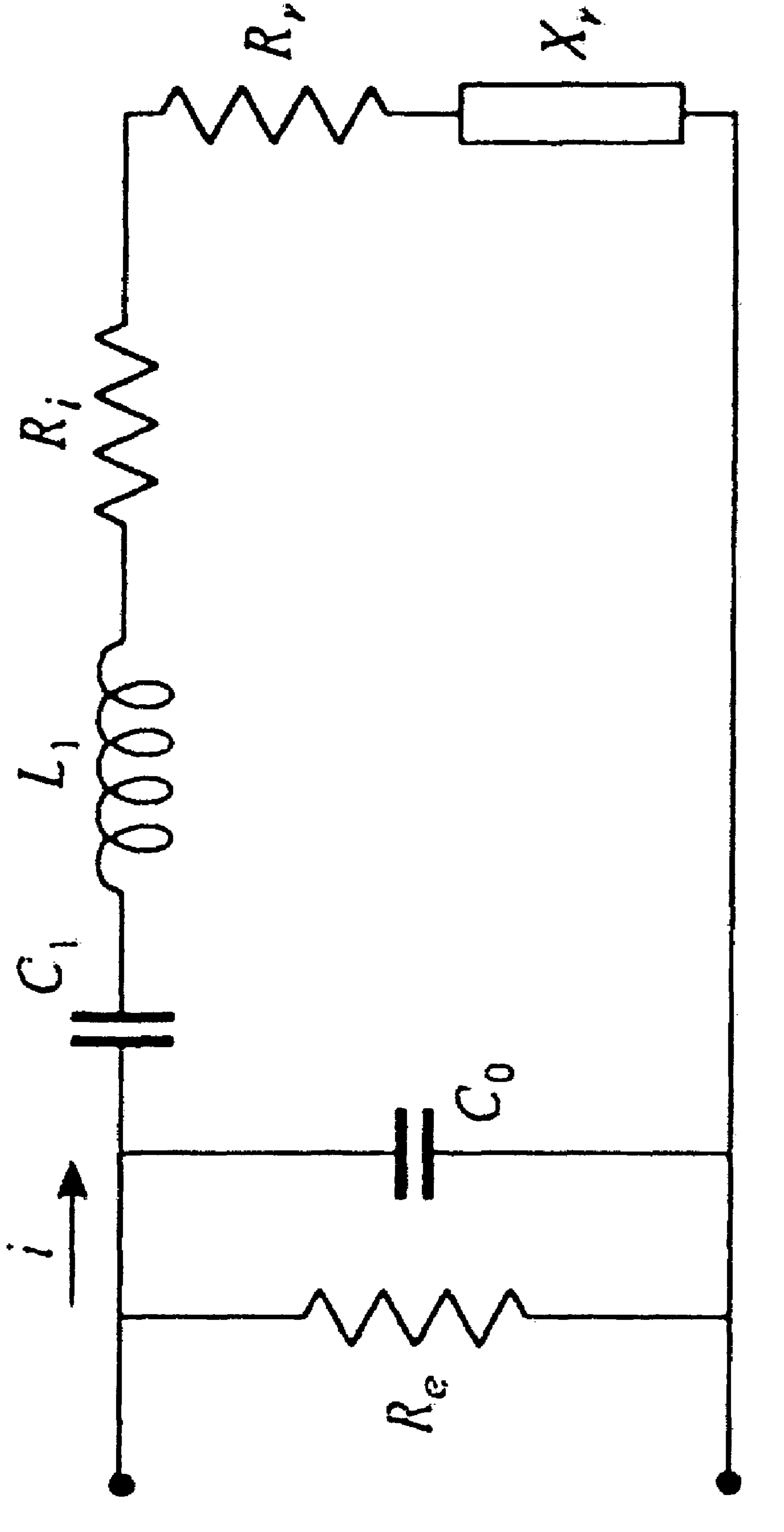
FIG. 2 is a diagram of an equivalent electrical circuit for modeling motional behavior of a transducer close to the resonance frequency.

There are a number of ways to measure the coupling coefficient and the most common involves a measurement of the resonance and anti-resonance frequency. The coupling coefficient is normally calculated using the formula $k=\sqrt{(1-(f_r/f_a)^2)}$. The motional behavior of a transducer close to the resonance frequency can be modeled using an equivalent electrical circuit as shown in FIG. 2. Typically, this equivalent electrical circuit includes a resistor $R_e$, for dielectric loss resistance, and a resistor, $R_i$ for the internal mechanical losses. The other components in the series circuit are the capacitor $C_0$, the capacitor $C_1$, the inductor $L_1$, the radiation resistor $R_r$ and the radiation reactance $X_r$.

Figure 4:
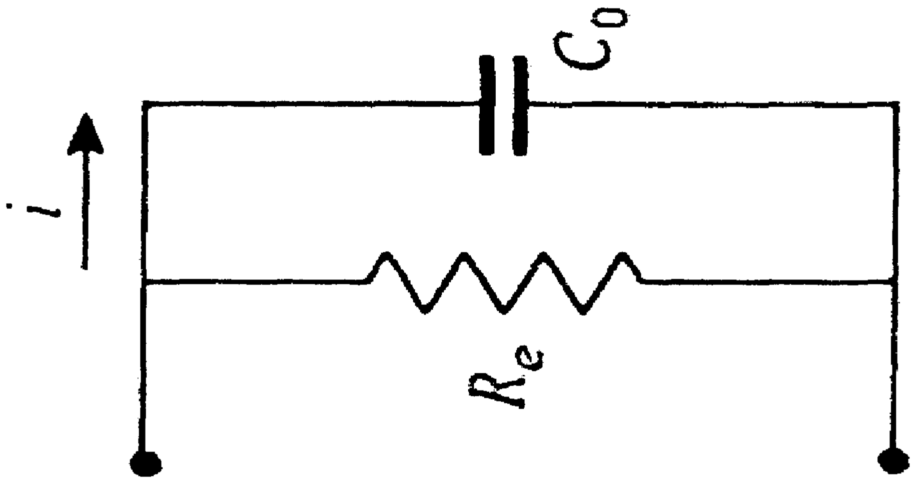
FIG. 4 is a diagram of a clamped equivalent electrical circuit for modeling a transducer at frequencies above resonance.
Figure 3:
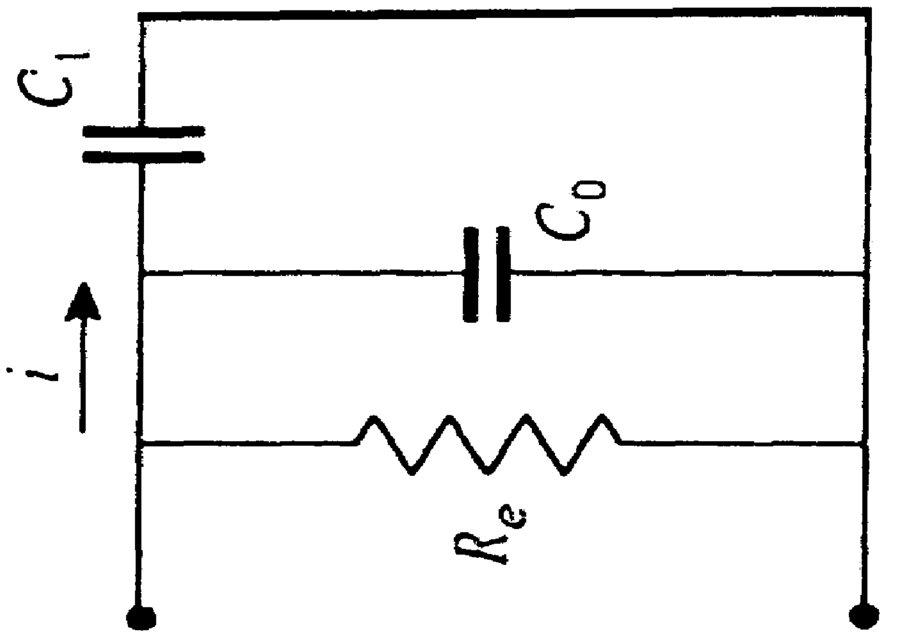
FIG. 3 is a diagram of a clamped equivalent electrical circuit for modeling a transducer at frequencies below resonance.

The electrical equivalent circuit can be analyzed by means of connecting a constant voltage generator at the input terminals and incrementing frequency over a range that includes the resonance frequency and the anti-resonance frequency. The value of impedance will be at a minimum at a frequency corresponding with the resonance frequency and at a maximum at a frequency corresponding with the anti-resonance frequency. Using the resonance frequency as a reference, the impedance will progressively increase in value as the frequency of the signal applied to the electrical equivalent circuit progressively extends downwards below the resonance frequency. As the frequency is decreased below the resonance frequency, the phase angle between the voltage and current will asymptotically approach −90°. For the frequency range where the phase angle is less than −89°, the real part of the current will be very small. It can be calculated by multiplying the current modulus by the cosine of the phase angle. For example, the cosine of −89° is equal to 0.0174. In the system of electrical and mechanical analogues. the equivalent circuit current, denoted by i in FIG. 2, is equivalent to velocity. Therefore, the velocity of the transducer over the frequency range where the phase angle is less than −89° will be very small and described by using the term "clamped" or by using the term "non-motional". Using the anti-resonance frequency as a reference, the impedance will progressively decrease in value as the frequency of the signal applied to the electrical equivalent circuit progressively extends upward above the anti-resonance frequency and the phase angle between the voltage and current will asymptotically approach −90°. Therefore, the frequency versus impedance and phase characteristic can arbitrarily be considered to be motional in regions where the phase angle is greater than −89° and clamped in the region where the phase angle is less than −89°. At frequencies well below resonance, the clamped equivalent electrical circuit is shown in FIG. 3 and at frequencies well above resonance the clamped equivalent electrical equivalent circuit is shown in FIG. 4.

This invention provide a method of velocity control that can compensate both for age related changes in transducer characteristics as well as the more immediate changes that occur during operation remains using only the clamped region of the circuit to determine a correction factor.

In one aspect of this invention, method of velocity control is provided comprising measuring or calculating a non-motional characteristic of a transducer at two predetermined frequencies, one below ($A_{lf}$) and one above the resonance frequency ($A_{hf}$). The phase angle between the applied voltage and $A_{lf}$ and $A_{hf}$ is measured and the transducer is determined to be non-motional provided the angle is less than −89°. For transducers that operate at or close to the motional resonance frequency, a linear relationship exists between the characteristic required to maintain a constant value of end effector velocity and a factor M. Factor M is defined as the square root of $(A_{lf}-A_{hf})/(A_{lf}+A_{hf})$. A transducer control system algorithm based on the calculation of an input current correction factor that is calculated by multiplying factor M by a device specific scaling factor causes the transducer to maintain a specified value of end effector velocity or displacement.

In one of the embodiment of this invention, the reactive current is measured or calculated at two predetermined frequencies, one below ($I_{lf}$) and one above the resonance frequency ($I_{hf}$). The phase angle between the applied voltage and $I_{lf}$ and $I_{hf}$ is measured and the transducer is determined to be non-motional provided the angle is less than −89°. Factor M is calculated for this system, wherein factor M is the square root of $(I_{lf}-I_{hf})/(I_{lf}+I_{hf})$. This correction factor is then applied to generator output currents.

In other embodiments of this invention, the impedance, admittance, reactance, susceptance, and capacitance are measured and the correction factor is determined based on these measurements.

In a further embodiment, a constant voltage is applied and maintained as the frequency is swept from below the resonance frequency to above the resonance frequency during the measurement of the characterictics, $A_{lf}$ and $A_{hf}$. Applying a constant voltage, simplifies the method as it avoids the need to measure the voltage during the frequency sweep.

Another aspect of this invention relates to the detection of secondary resonances that could degrade the accuracy of the velocity control method. These secondary resonances are detected by the measurement of significant motional components in the normally clamped region of the transducer impedance/phase characteristics. The phase angle between the applied voltage and the currents, $I_{lf}$ and $I_{hf}$, is measured. The presence of either a secondary resonance or a significant shift in the primary resonance is detected by the measured value of phase angle that exceeds a pre-determined threshold. Typically, the detection threshold would be set at a phase angle greater than −89°, but in practice a tolerance needs to be applied that accounts for the piezo tan δ loss and the measurement accuracy of the control system. The measurement of a motional component in $I_{lf}$ or $I_{hf}$, detected by the control system, could be used to either disable power to the transducer or trigger further diagnostic testing. The diagnostic testing could include the determination of factor M at different frequencies by, for example, increasing the upper frequency by 500 Hz and decreasing the lower frequency by 500 Hz. The PiezoTran computer model can be used to calculate a relationship between the ratio of the upper frequency to the lower frequency (defined as >) and factor M. For example, factor M for a particular design of surgical transducer was found to be equal to 1.0217 times $\beta^{12.746}$. The accuracy of the calculation of factor M is dependant on the measurement accuracy of $I_{lf}$ and $I_{hf}$. The accuracy could therefore be improved by multiple measurements of $I_{lf}$ and $I_{hf}$ at β related frequencies. An average value of factor M could then be determined A further aspect of this invention relates to a method of determining a device specific numerical scaling factor that is related to changes in the piezo material properties. This scaling factor is related to the effective coupling coefficient of the transducer and end effector and also to the $k_{33}$ of the piezo material. The $k_{33}$ will typically slowly degrade over the life of the device and the amount of degradation depends on the age of the material and environmental factors. Both the effective coupling coefficient of the device and factor M are directly proportional to the value $k_{33}$ of the piezo. A scaling factor for the input current required to maintain a constant value of end effector velocity can therefore be determined from any two independent measurements of factor M and the respective input current. The accuracy of the scaling factor can be improved by determining factor M for a new transducer and for a transducer at the end of its useful life. For new transducers, the relationship can be determined using measured data, preferably from a statistical sample of transducers with the end effector attached. It is important to ensure that these transducers do not have any secondary resonances and that the cable lengths are the same.

In one embodiment of the invention to determine the scaling factor, the sequence is as follows:

Step 1. Apply a low power test to all transducers. In this test, an impedance analyzer such as the HP4194A or equivalent is used to measure the resonance frequency (Fr) and the anti-resonance frequency (Fa). The effective coupling coefficient can be calculated using the formula $k=\sqrt{(1-(f_r/f_a)^2)}$. Measure and plot the impedance and phase angle versus the frequency. Ensure the range extends into the clamped region, defined as the portion of the frequency phase characteristic below and above resonance, where the phase angle is less than −89°.

Step 2. Estimate the range of acceptable variation in resonant frequency with respect to manufacture tolerances and operational conditions. For example, for a medical transducer with a horn that has a velocity gain of 5, the manufacture tolerance with respect to resonance frequency is +0.5%. During high power operation the resonant frequency tolerance is +0.5% and −1%".

Estimate the value of a frequency ($f_l$) that will remain in the clamped region below resonance considering possible variations in the resonance frequency. Similarly, estimate the value of a frequency ($f_h$) that will remain in the clamped region above the resonance frequency.

Step 3: Connect the transducer to instrumentation, such as that shown in FIG. 6. Slowly increase signal generator voltage while continuously adjusting the resonant frequency in order to maintain a zero phase angle between the voltage and current. Increase the signal generator output until the end effector reaches the required value of velocity or displacement as measured by the laser vibrometer. Measure the transducer input current. Without changing the applied voltage, change the signal generator frequency sequentially from a frequency below the resonance frequency, $f_l$, to a frequency above the resonance frequency, $f_h$, and measure the currents, $I_{lf}$ (current measured at a frequency below resonance) and $I_{hf}$ (current measured at a frequency above resonance). Check the validity of the current measurements by ensuring the applied voltages are approximately equal and the phase angle is less than −89°.

From this data, calculate Factor M, which is defined as the square root of $(I_{lf}-I_{hf})/(I_{lf}+I_{hf})$.

Step 4. The end-of-life performance of a transducer can be simulated using transducer analysis software, such as, for example, but not limitation PiezoTran™. Alternatively, transducers can be artificially aged to replicate the end-of-life performance by subjecting them to heat cycles that typically range from 140° C. to 180° C. PiezoTran™ is able to simulate the performance of the transducer with an end effector attached and can rapidly iterate to a "best-fit" with the measured data for the new transducers. It is important to obtain reasonably close agreement with the measured values of resonant frequency, tip displacement, and input current. For medical transducers that have to withstand multiple steam sterilization cycles and have a life expectancy of 2 years, the degradation in piezo $k_{33}$ will be approximately 40%. The manufacturer's published value of $g_{33}$ should therefore also be reduced by 40% and used as input data for the PiezoTran™ computer model. The constant $g_{33}$ denotes the piezo property that relates electric field divided by applied stress for an axially poled piezo ring or plate. Use the model to calculate and plot impedance and phase versus frequency. Adjust the voltage such that the end effector tip velocity is the same as that measured for the new transducer. This value would normally be the maximum specified in the transducer test procedure. Estimate the percent degradation in the piezo $k_{33}$ that is likely to occur throughout the useful life of the transducer. Take into account aging and operational factors such as multiple steam sterilization cycles. Reduce the value of the piezo input parameter $g_{33}$ by the estimated percent of degradation in $k_{33}$. Use the model to calculate and plot the impedance and phase characteristic. Adjust the voltage such that the end effector tip displacement is the same as a new transducer and note the value of input current. As the model applies a constant voltage, the currents, $I_{lf}$ and $I_{hf}$, can be calculated by dividing the voltage by the impedance at $f_l$ and $f_h$. Calculate factor M for the end-of-life transducer. As there is a straight-line relationship between factor M and input current, the slope of the graph can be calculated from the new and end-of-life data. The relationship between factor M and input current would normally be determined for the maximum specified value of end effector displacement. A target end effector velocity is achieved by scaling the input current with reference to this maximum value and applying a further correction based on factor M.

Figure 5:
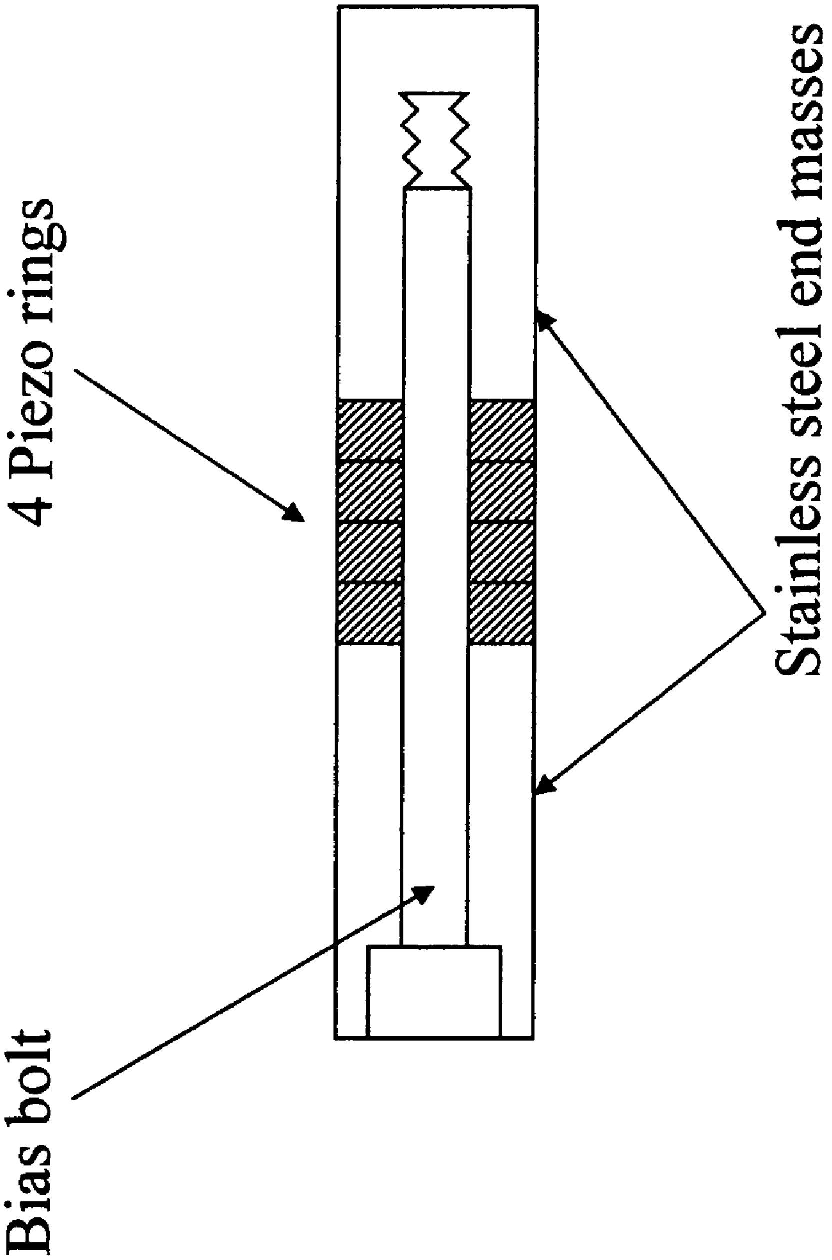
FIG. 5 is an illustration of a bolted dumbbell half wavelength transducer.
Figure 6:
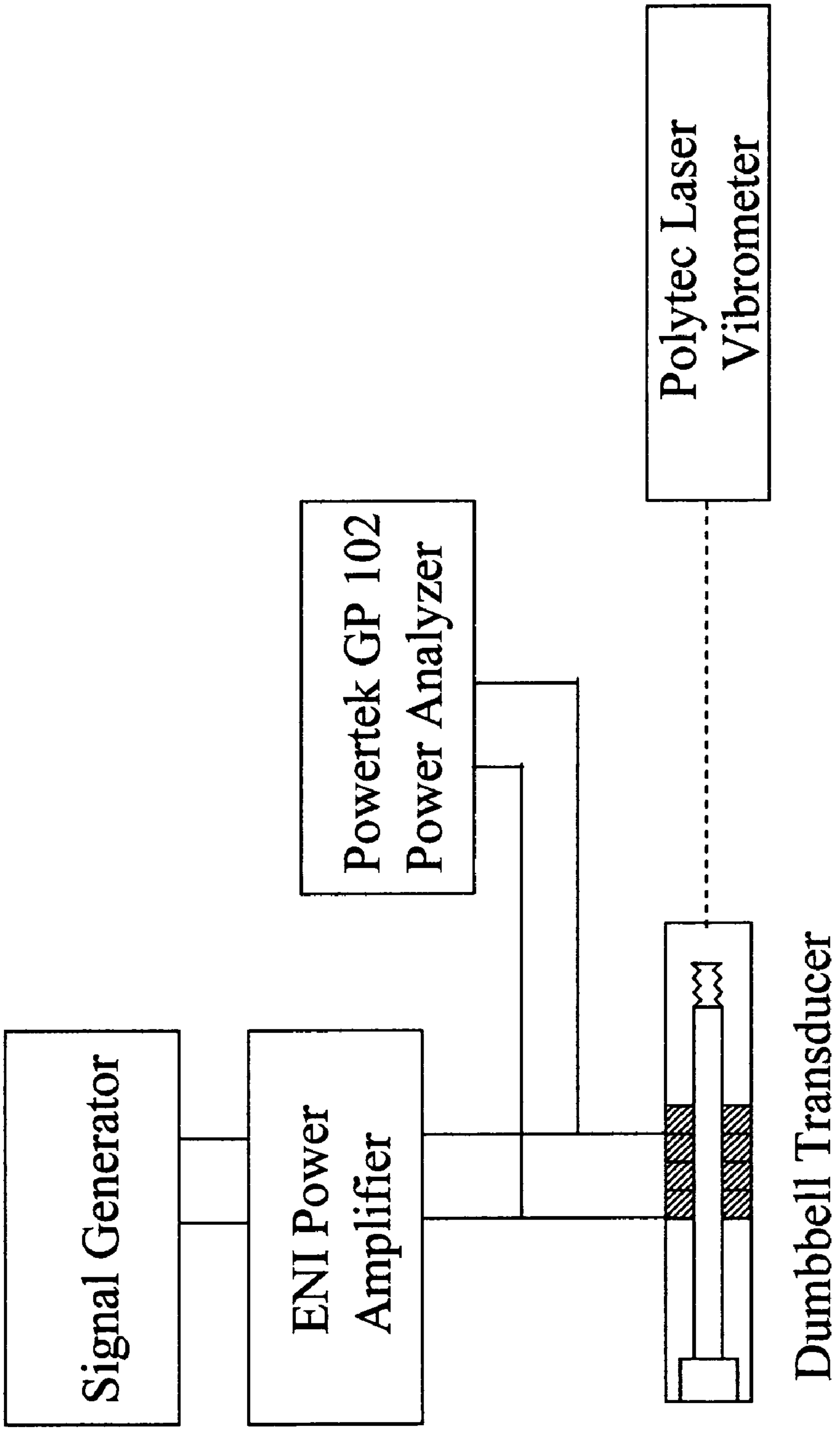
FIG. 6 is a block diagraph showing the connection of the transducer to the device to determine the linear device specific scaling constant and the effective coupling coefficient.

By means of an illustrative example, a bolted dumbbell half wavelength transducer, as shown FIG. 5, can conveniently be used to evaluate the transducer coupling coefficient and hence, performance in isolation from the effects of horns and end effectors. Specifically, the objective of the example is to confirm by practical experiment the linear relationship between input current and coupling coefficient and confirm the result by means of a computer model. It is important to establish this relationship in order to demonstrate that factor M is proportional to the coupling coefficient. The 4 piezo rings of the transducer used in this example have an outside diameter of 10 mm, an internal hole diameter of 5 mm and a thickness of 2 mm. The end masses are stainless steel and the piezo bias stress was applied by means of a socket head high tensile steel bolt. The nominal half wavelength resonance frequency of this transducer was 40 kHz. A measurement system was set up and an experiment was conducted to determine the relationship between the coupling coefficient and the input electrical current required to maintain a constant value of end mass velocity. A block diagram of the measurement system is shown in FIG. 6. The power analyzer is used to simultaneously measure transducer voltage, current, phase angle, frequency, and power. For this experiment, the frequency was continuously adjusted to maintain zero phase angle between the voltage and current. The velocity of the front face of the dumbbell transducer was measured using a laser vibrometer and was maintained at a constant value of 1 m/s. A computer controlled Hewlett Packard impedance analyzer was used to measure and calculate the coupling coefficient. The piezo material was progressively degraded by subjecting the transducer to single incremental temperature cycles up to a maximum of 180° C. Approximately 24 hours after each temperature cycle, the coupling coefficient was again measured and also the current to maintain a front face velocity of 1 m/s was measured.

Figure 7:
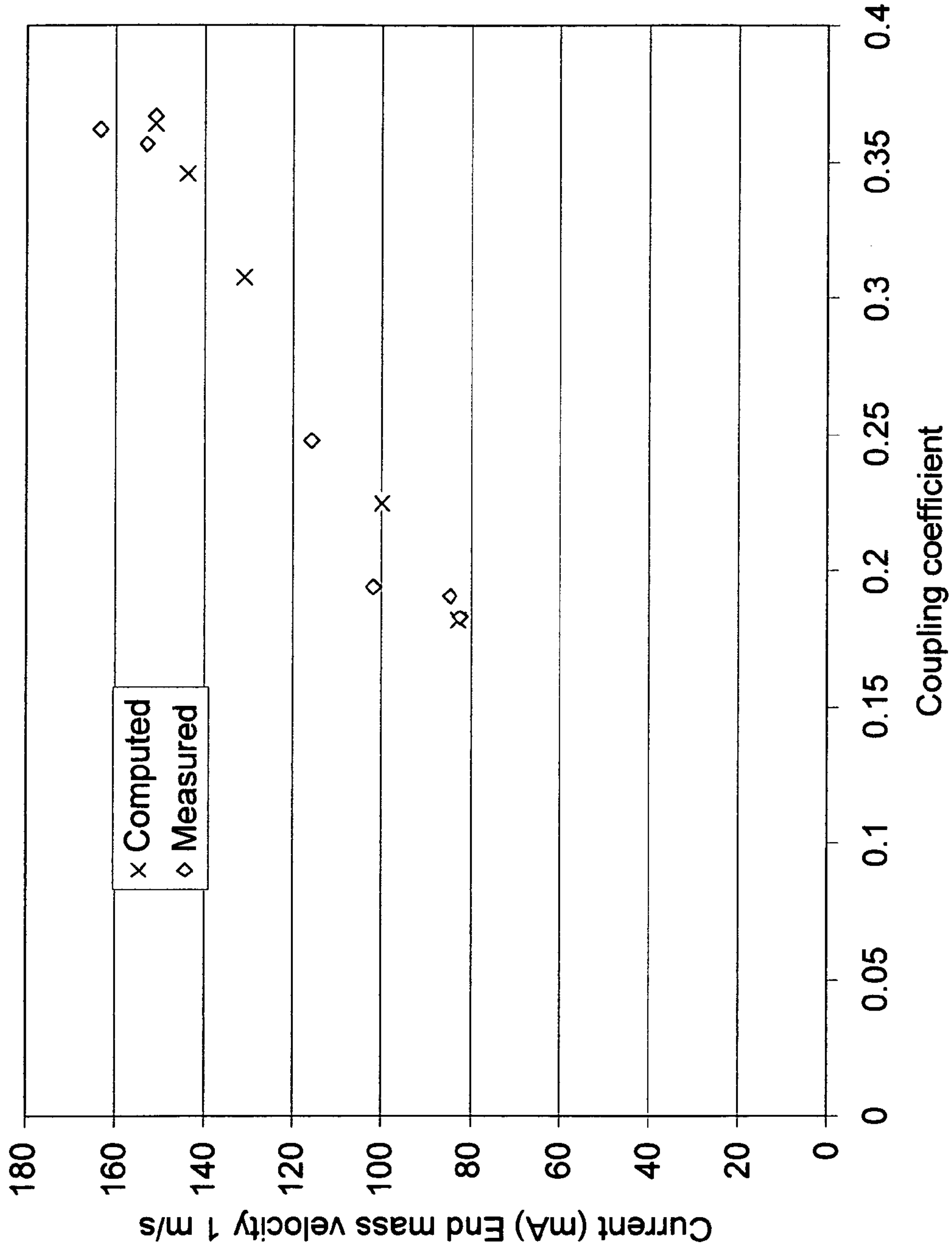
FIG. 7 is a graph comparing the computed and experimental data of the input electrical current versus the coupling coefficient.

The relationship between the coupling coefficient and the input electrical current can also be determined by means of a computer model. PiezoTran™ is a transducer analysis software that is based on acoustic transmission line theory. The piezo material property that relates electric field divided by applied stress for an axially poled piezo ring or plate, denoted as $g_{33}$ is required input data for the PiezoTran™ and this is directly proportional to $k_{33}$. The model output includes resonant frequency, end mass displacement, input current, and transducer effective coupling coefficient. By incrementally reducing the value of $g_{33}$, the model can simulate the degradation of the coupling coefficient caused by the temperature cycles in the practical experiment. The experimental and computed data are shown in FIG. 7.

Langevin style transducers used for ultrasonic medical, dental and industrial applications usually incorporate a horn that amplifies velocity. The theory relating to these horns is described in a number of ultrasonic transducer design reference books. The simplest form of a horn is a half a wavelength long, has a step at the center, and has a distal cross section area that is less than the cross section area of the piezo ceramic elements. Increase in velocity is proportional to the ratio of the cross section area of the proximal portion of the horn to the reduced cross section area of the distal portion of the horn.

Figure 8:
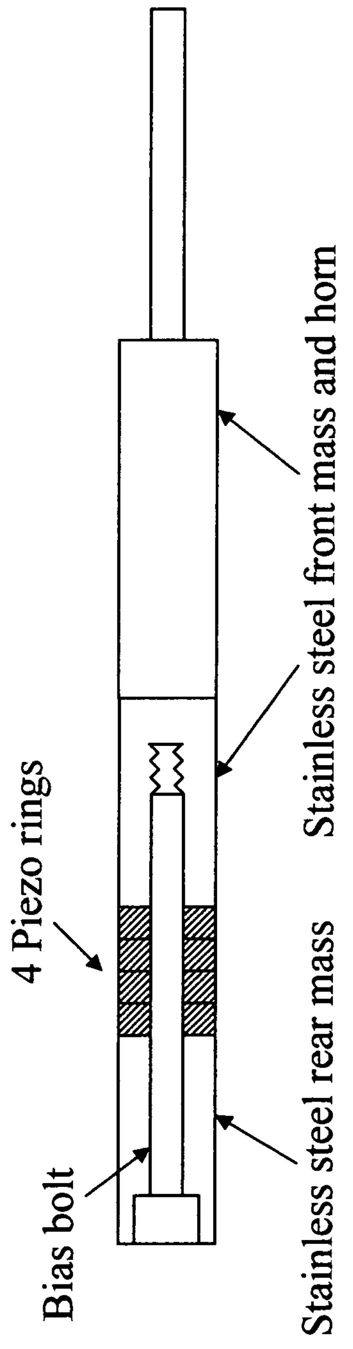
FIG. 8 is an illustration of a horn coupled to a dumbbell transducer.

FIG. 8 illustrates a conceptual horn that has an increase in cross section area of 10 to 1, which has been coupled to a dumbbell transducer. As mechanical energy is stored within the horn, the measured value of the effective coupling coefficient for the transducer with the horn attached will be lower than that of a simple half wavelength dumbbell transducer without the horn attached. For example, the PiezoTran™ computer model predicts a coupling coefficient k=0.364 for the dumbbell transducer and a value of k=0.143 with the horn attached. The value of the measured effective coupling coefficient with the horn attached can be very misleading in that optimizing the horn gain results in a lower value of coupling coefficient while optimizing the joint losses in the attached dumbbell transducer will result in a higher value coupling coefficient. The situation is further complicated by the attachment of wave-guides and or end effector tools to the horn. Although the actual measured value of the coupling coefficient can be meaningless in this situation, the subsequent changes that occur as a result of variation in the piezo properties will still be proportional to the changes in current required to maintain constant end effector velocity. Therefore, one aspect of this invention is based on the premise that the relatively complex measurement of the effective coupling coefficient can be replaced by a related factor, factor M, that is easier to measure.

Determining the value of coupling coefficient or phase margin is relatively complex to implement within a system control algorithm. This invention relates to a method for determining a correction factor that is proportional to the coupling coefficient, whereby in one embodiment the reactive current and phase angle are measured rather than capacitance. With a constant voltage applied to the transducer, the non-motional reactive current is measured at two predetermined frequencies, one below ($I_{lf}$) and one above the resonance frequency ($I_{hf}$). The phase angle between the applied voltage and $I_{lf}$ and $I_{hf}$ is measured and the transducer is determined to be non-motional provided the angle is less than −89°. For transducers that operate at, or close to, the motional resonance frequency, a linear relationship exists between the current required to maintain a constant value of end effector velocity and a factor M, which is defined as the square root of $(I_{lf}-I_{hf})/(I_{lf}+I_{hf})$. A transducer control system algorithm based on the calculation of the input current correction factor M causes the transducer to maintain a specified value of end effector velocity or displacement.

The calculated value of factor M will depend on the specific configuration of the transducer, horn, and end effector. For transducers that utilize different types of end effectors, factor M could be determined immediately prior to operational use and before attaching any wave-guides or other tools, including the end effectors, to the transducer. Alternatively, the system could be designed to detect and compensate for different types of end effectors. For surgical applications, the end effectors are usually single use disposable items that are packaged in sealed sterile packs. It would therefore be possible to include a single use electronic or mechanical key that would identify the type of end effector. The key would be inserted in the control system and both enable power to be applied to the transducer and to apply the appropriate velocity control correction factor based on the specific end effector attached.

When designing a new transducer that includes a horn and end effector, it is normal practice to optimize the design of the half wave active dumbbell section before attaching the horn and end effector. In the final design, the front mass of the dumbbell will be incorporated with the horn as a single component. For a new design or redesign of a transducer, factor M, the correction factor should be determined with the end effector attached to the transducer. Ideally, a statistical sample of new transducers from a pre-production lot should be used. It is important to ensure that transducers with secondary resonances are excluded from the statistical sample. Secondary resonances can be identified by plotting the frequency versus impedance and phase. It is also important that production quality cables/connectors are used. Variations in cable length and capacitance can affect the accuracy of the factor M calculation. Factor M, the correction factor, would also need to be determined if any changes were made to the end effector.

A method for determining factor M for both a dumbbell transducer and a practical design that includes a horn and end effector are described below by means of illustrative examples.

Figure 9:
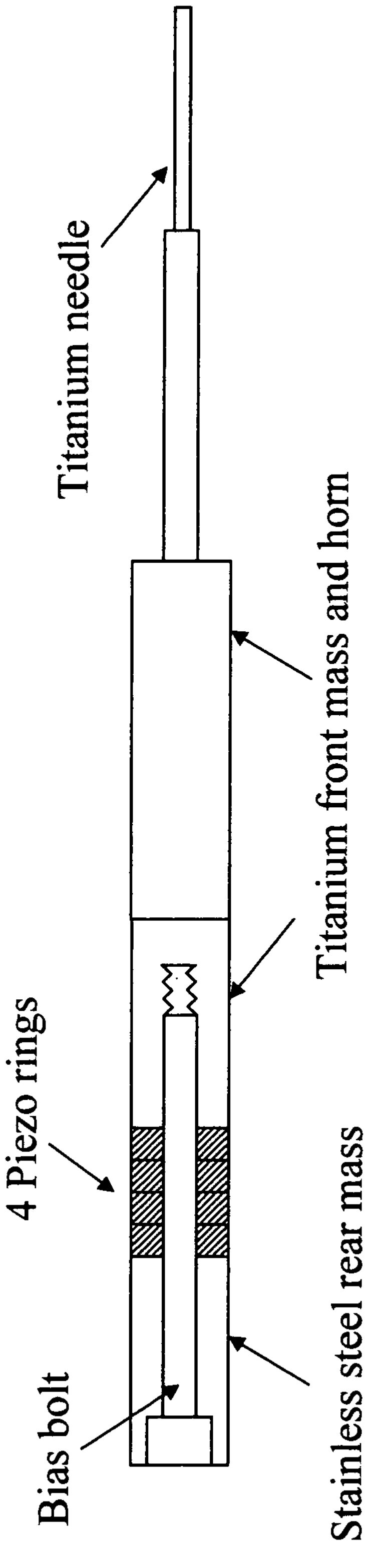
FIG. 9 is an illustration of a phacoemulsification transducer coupled to a horn with an end effector.

In these examples, the performance of barium titanate piezo material for a single use transducer in cataract surgery was evaluated. The ultrasonic cataract surgery procedure is known as phacoemulsification and the transducer used is referred to, herein as a phaco transducer. Although barium titanate has a $k_{33}$ that is approximately half that of PZT piezo, it has a very low Curie temperature of 115° C. Should any attempt be made to reuse the device by steam sterilizing it after use, the barium titanate would loose its piezo activity and be rendered inoperable. FIG. 9 is an illustration of such a phaco transducer.

A Hewlett Packard impedance analyzer was used to measure the impedance and phase of both the dumbbell and phaco transducers over a relatively wide frequency range. For the initial characterization of the transducer, the clamped non-motional characteristic below and above the motional longitudinal resonance is measured. The transducer is considered to be clamped, i.e. non-motional, over the portion of the frequency versus phase characteristic where the phase angle between the applied voltage and current is less than −89°. Providing the piezo tan delta loss is low, the value of resistor $R_e$ will be much greater than the capacitive reactance and can be considered to approximate to an open circuit condition. Therefore, the clamped performance of the transducer can then be modeled below the resonance frequency using a parallel pair of capacitors as shown in FIG. 3 and above the resonance frequency using a single capacitor as shown in FIG. 4. The reactive impedance Xc can be calculated using the equation:

$$Xc=1/(2\pi FC), \text{ where F=frequency, and C=capacitance}$$

For the clamped condition, the impedance of the transducer will therefore be inversely proportional to the value of capacitance.

Figure 10:
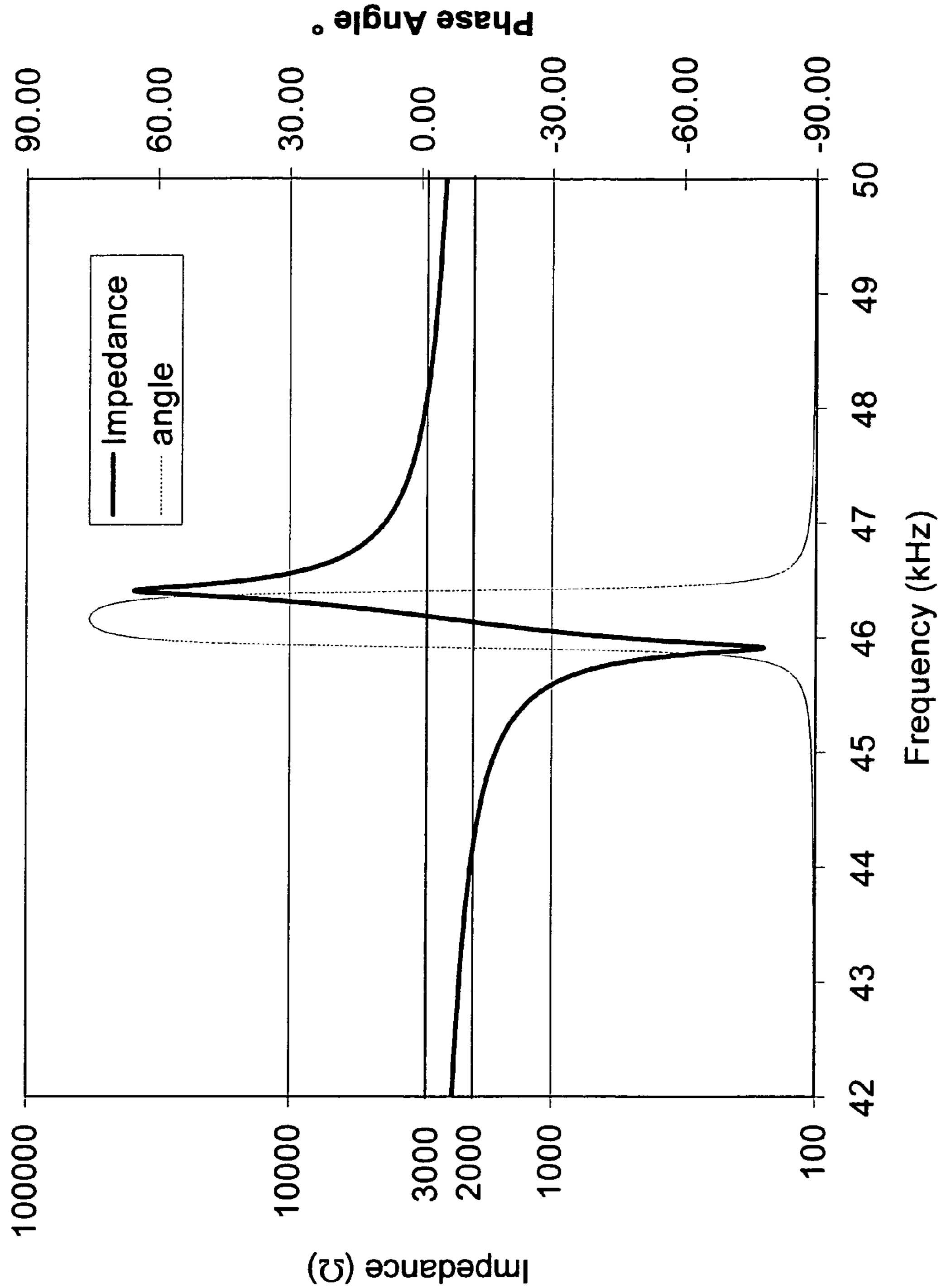
FIG. 10 is a graph of the measured impedance and phase characteristic versus frequency for a dumbbell transducer.

The measured impedance and phase angle versus frequency for the dumbbell transducer is plotted and shown in FIG. 10. If a constant voltage is applied throughout the swept frequency range, the current will be inversely proportional to the impedance and therefore proportional to the capacitance, provided that the phase angle is less than −89°. From inspection of the impedance and phase angle plot, shown in the FIG. 10, the phase angle is less than −89° over the frequency range of 42 kHz to 44 kHz below resonance and less than −89° over the frequency range of 48 kHz to 50 kHz above resonance. The calculation of the velocity correction factor M involves the selection of 2 arbitrary frequencies, one in the frequency range 42 kHz to 44 kHz and the other in the frequency range 48 kHz to 50 kHz. The choice involves a tradeoff between selecting widely separated or closely separated frequencies. The advantage of selecting widely separated frequencies is accommodating shifts in the transducer resonant frequency. The advantage of selecting closely separated frequencies is that the difference between the measured values of current will be greater and less susceptible to measurement error. The method involves a subtraction $(I_{lf}-I_{hf})$ and, as illustrated in FIG. 10, the values of $I_{lf}$ and $I_{hf}$ trend closer to the same value as the frequency separation is increased. Regardless which frequencies are selected, use of the resultant calculated correction factor M will optimize the performance of the device.

There will be no need to measure the resonance frequency in operational use because this is normally tightly controlled.

For medical ultrasonic transducers the horn and end effector have a major stabilizing influence on the resonance frequency of the device and considerably reduce the variability. By inspection of the impedance graph, FIG. 10, it can be seen that moving the resonant frequency down to 45 kHz would still ensure a clamped condition with a phase angle <89° at the 42 kHz. It can also be seen that moving the resonance frequency down results in a similar value of reduction in impedance at both 42 kHz and 50 kHz. Therefore, the ratio of the measured currents, $I_{lf}$ and $I_{hf}$, will remain the same and not degrade the accuracy of the correction factor M that in this example is the square root of $(I_{lf}-I_{hf})/(I_{lf}+I_{hf})$.

The advantage of selecting closely separated frequencies is associated with improved measurement accuracy and resolution of currents, $I_{lf}$ and $I_{hf}$. The illustrative examples represent a worst case scenario because barium titanate has a value of $k_{33}$ that is approximately half that of PZT. The separation $(I_{lf}-I_{hf})$ will therefore be greater for all currently existing transducers that exclusively use PZT.

Figure 11:
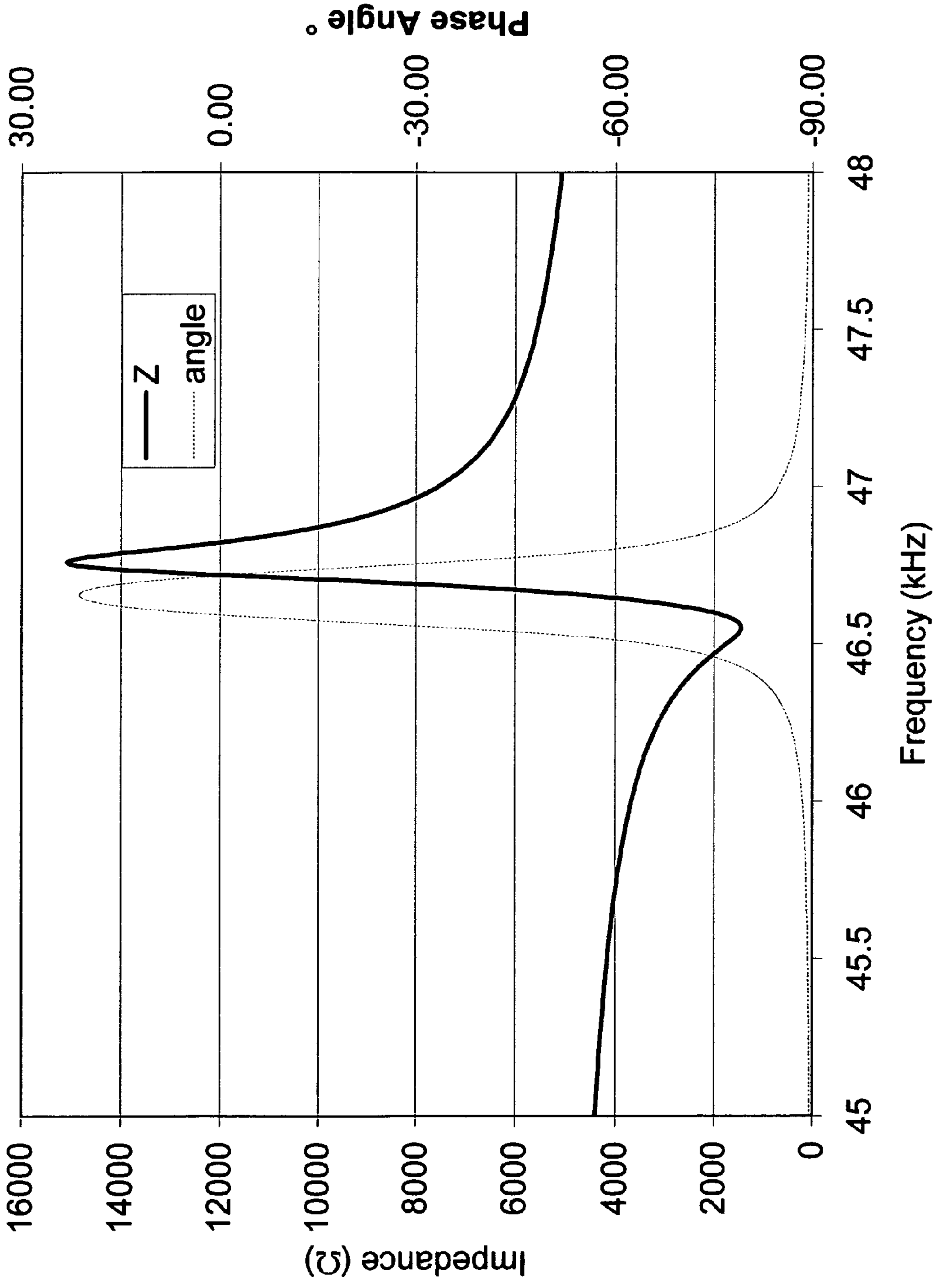
FIG. 11 is a graph of the measured impedance and phase angle versus frequency for a phacoemulsification transducer.

Converting a dumbbell transducer into a phaco transducer involves the addition of a horn and needle (end effector). A graph of the measured impedance and phase angle versus frequency for the phaco transducer is shown in FIG. 11. This graph can be compared with the graph of the impedance and phase angle versus frequency of the dumbbell transducer shown in FIG. 10. The addition of the horn and needle reduces the effective measured coupling coefficient by 35% from 0.146 to 0.095 and reduces the motional frequency range (defined by a phase angle >−89°) by 17% from 2.152 kHz to 1.77 kHz. By means of an illustrative example, the correction factor M can be calculated by applying a constant voltage and measuring the current at 45 kHz and 48 kHz. The measured impedance at 45 kHz was 4401Ω with a phase angle of −89.55° and at 48 kHz was 5082Ω with a phase angle at −89.25°. Since the impedance analyzer applies one volt, the currents will be 0.227 mA ($I_{lf}$) at 45 kHz and 0.1967 mA ($I_{hf}$) at 48 kHz.

As, factor M in this example is the square root of $(I_{lf}-I_{hf})/(I_{lf}+I_{hf})$; then factor $M=\sqrt{((0.227-0.1967)/(0.227+0.1967))}=0.267$.

If the transducer used in the illustrative example is used in a typical medical operational environment the effective coupling coefficient will decrease by approximately 40% at the end of useful life. Since factor M is proportional to coupling coefficient the value of factor M will be approximately 0.160

The method was also validated by means of a further practical experiment using a transducer that uses PZT piezo material and incorporated a horn that had a velocity gain of approximately 5 to 1. The effective coupling coefficient was calculated from impedance analyzer measurements of the resonance frequency ($f_r$) and anti-resonance frequency ($f_a$) using the equation:

$$k=\sqrt{(1-(f_r/f_a)^2)}$$

Figure 12:
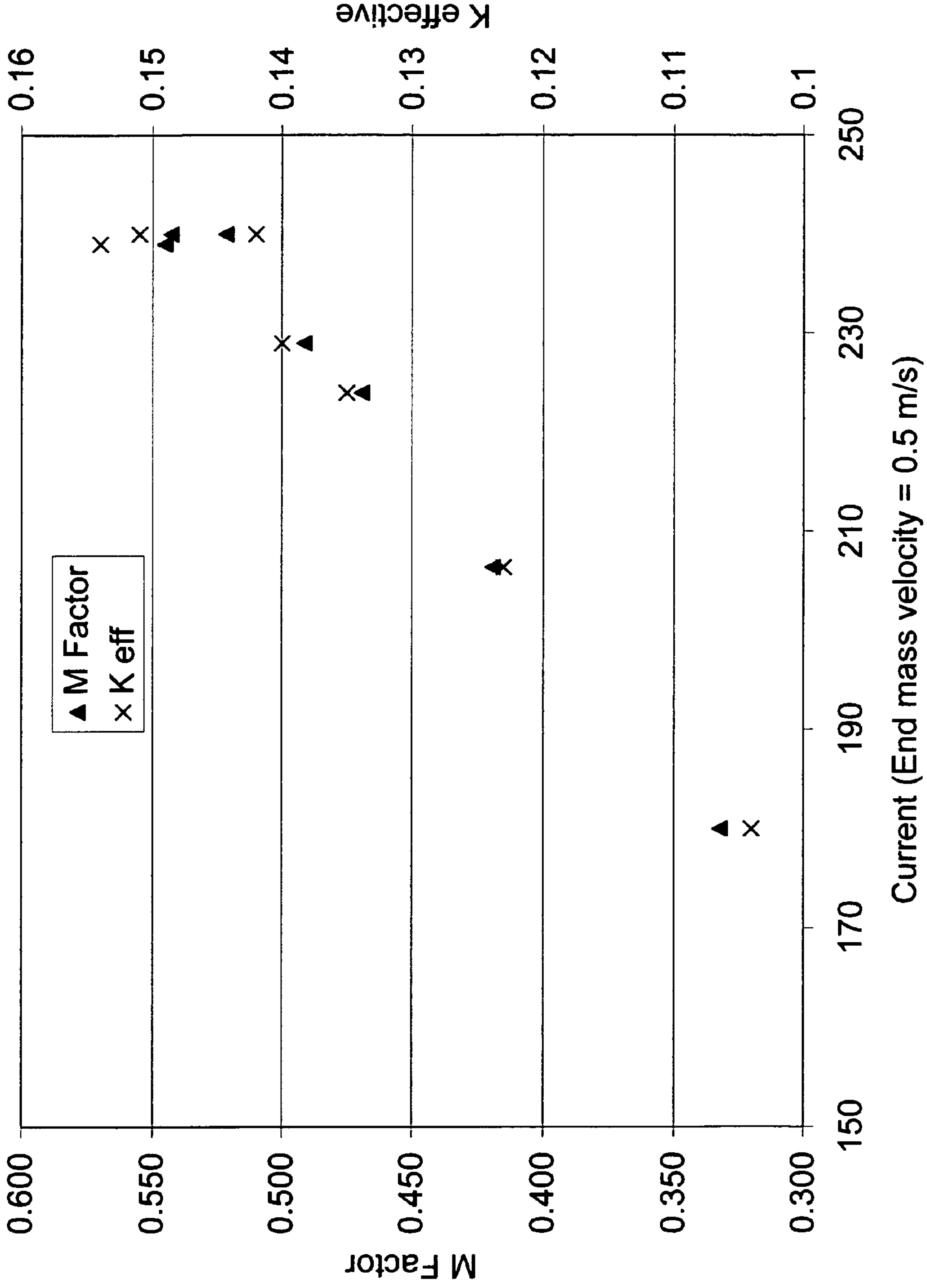
FIG. 12 is a graph of the correction factor M and the effective coupling coefficient versus current for a PZT piezo transducer.

Following this low power motional method of measuring the effective coupling coefficient the transducer was tested at higher power using the instrumentation shown in FIG. 6. The resonant frequency was continuously adjusted to maintain a zero phase angle between the voltage and current. The signal generator output was increased until the end mass velocity measured by the laser vibrometer was 0.5 m/s. The transducer input current and power were measured using the power analyzer. Without changing the applied voltage, the signal generator frequency was sequentially switched to two arbitrary frequencies, one below resonance and one above resonance. The currents, $I_{lf}$ and $I_{hf}$, were measured along with the voltage and phase angle. The current measurements were considered valid if the voltages were equal and the phase angle was <−89°. The piezo material was progressively degraded by subjecting the transducer to incremental temperature cycles up to a maximum of 200° C. Approximately 24 hours after each temperature cycle, the coupling coefficient was measured and also the current to maintain an end mass velocity of 0.5 m/s. FIG. 12 illustrates how degrading the piezo material $k_{33}$ results in less current to maintain the same velocity at the end mass of the transducer. As can be seen, the relationship between the motional low power method of measuring the effective coupling coefficient and the high power clamped measurements of current for determining a factor M are strongly correlated and validate the use of factor M as an equivalent substitute for the effective coupling coefficient as a correction factor to optimize performance of a transducer.

Transducer secondary resonances can be caused by a number of reasons and are generally indicative of faulty or substandard manufacture. As such, routine production testing at low power would detect the presence of the secondary resonance and these transducers would not be used. Secondary resonances can be identified by plotting the frequency versus impedance and phase. Secondary resonances can also be caused by the attachment of wave-guides and tools and can be superimposed on the main longitudinal resonance as shown in FIG. 1. They can also be shifted from the main resonance and introduce a motional component in the normally clamped frequency range. There is typically a significant phase angle perturbation associated with a secondary resonance. Therefore, if the measurement frequency of $I_{lf}$ or $I_{hf}$ coincided with a secondary resonance the control system would detect and flag an error condition since the phase angle would be greater than −89°. For example, during operational use at high power the ultrasonic energy can cause the end effector coupled by threading to loosen. It would be very important to detect this failure and turn off the power supplied by the control system. If a secondary resonance occurs in the motional region of the transducer, the effective coupling will be marginally reduced since additional energy is being dissipated by the interfering mode of vibration. Under this condition factor M could erroneously detect a lower effective coupling condition and reduce the current accordingly. This would result in a decrease in end effector velocity and a potentially fail safe situation.

It will be obvious to those skilled in the art that the methods of the invention can also be applied to a transducer that has an inductive tuning coil or transformer electrically connected either in series or parallel. For the parallel tuned condition, the phase angle corresponding with the clamped characteristic will be +90° and the impedance below resonance will be higher than the impedance above resonance. The equation for calculating factor M will be modified to:

$$\sqrt{((I_{hf}-I_{lf})/(I_{lf}+I_{hf}))}$$

Yet another aspect of this invention is based on velocity control using power measurements and the design and application of a fixed controlled end effector load. One embodiment of this aspect involves a methodology for determining and applying a controlled fixed loading condition to the distal tip of end effectors used in a variety of surgical and dental applications. Another embodiment of this aspect is based on measurements of current at the resonance and anti-resonance frequencies. A further embodiment of this aspect is a methodology for velocity control based on a measurement of the current required to deliver a pre-determined value of power into a load that is attached to the distal tip of the transducer end effector.

U.S. Pat. No. 6,203,516 to Kepley describes a control algorithm based on constant power that is used to control phacoemulsification transducers. In this application saline-based irrigation fluid flows over the end effector (titanium needle) and the transducer horn. The fluid is aspirated through a lumen that is located in the center of the transducer and extends along the entire length. During operational use the ultrasonic energy dissipated in the fluid produces a continuous loading effect that is much greater than the loading at the needle tip caused by the fragmentation of the cataract. Therefore, the needle tip displacement can be controlled by the application of a constant value of electrical power. The value of power is calculated from measurements of voltage (V), current (I), and phase angle ($\theta$) using the formula, power=V times I times cos $\theta$. Variations in the linear relationship between current and needle tip displacement, such as those caused by piezo aging, are automatically compensated for by adjusting the voltage.

Constant power control is not effective, however, in applications where the end effector load changes significantly during operational use. For example, ultrasonic scalpels are also used to dissect tissue planes at relatively low power and then coagulate blood vessels at relatively high power. Changing the modality of the end effector results in a sudden rapid increase in the power dissipated by the end effector. For this application, constant current is used because it maintains the end effector displacement at a constant value and automatically increases power in response to the increase in load.

Thus, for some applications, it would be advantages to calibrate the transducer using a constant power algorithm with a stable load attached to the distal tip of the end effector and then revert to a constant current control algorithm for operational use. By means of an illustrative example, the application of a system control algorithm based on a phase-lock-loop is used. Constant current control algorithms normally automatically compensate for changes in resonant frequency by means of a phase-lock-loop circuit that maintains a target phase between the voltage and current. A typical phase response of a phaco transducer is shown in FIG. 11 and increasing the load will increase the impedance and reduce the maximum value of phase angle. For extreme loading conditions, such as those imposed by the calibration load, the phase angle will not achieve a positive value and therefore target phase angles as low as −60° are sometimes used. Based on the assumption that the target phase will be 60°, the transducer can be calibrated by detecting and maintaining this phase angle. The voltage will be progressively increased until the maximum value of power is reached and this value of current is stored within the system's memory. Following the calibration the load is removed and the control system reverts to constant current control of tip velocity. The value of calibration current stored in the system memory can then be directly used or scaled in order to maintain linear control of the end effector velocity and displacement.

The resonant characteristic of a transducer can be represented by an equivalent electrical circuit shown in FIG. 2. When measured in air, the value of $R_r$ and $X_r$ are very small compared with the internal losses $R_i$. For example, the Q of a generic phacoemulsification transducer measured in air is typically >1000 resulting in a value of $R_i$<150Ω. Q is proportional to the energy stored in each cycle divided by the energy dissipated in each cycle. The internal losses are variable and measured values of minimum impedance for this transducer would range from 75Ω to 200Ω. For a constant voltage test condition, the magnitude of measured quiescent power will be variable and inversely proportional to the measured value of Zmin. Zmin is a minimum value of impedance at or close to the transducer resonance frequency. Phacoemulsification transducers are normally high power tested and characterized with a water filled boot that encloses the needle. The Q factor associated with this cavitation load is typically 150 and the combined value of $R_r$ and $R_i$ will be approximately 1200Ω. As the cavitation load varies with voltage drive level, a need exists for a stable test load that is approximately representative of the cavitation load at maximum end effector velocity.

Figure 13:
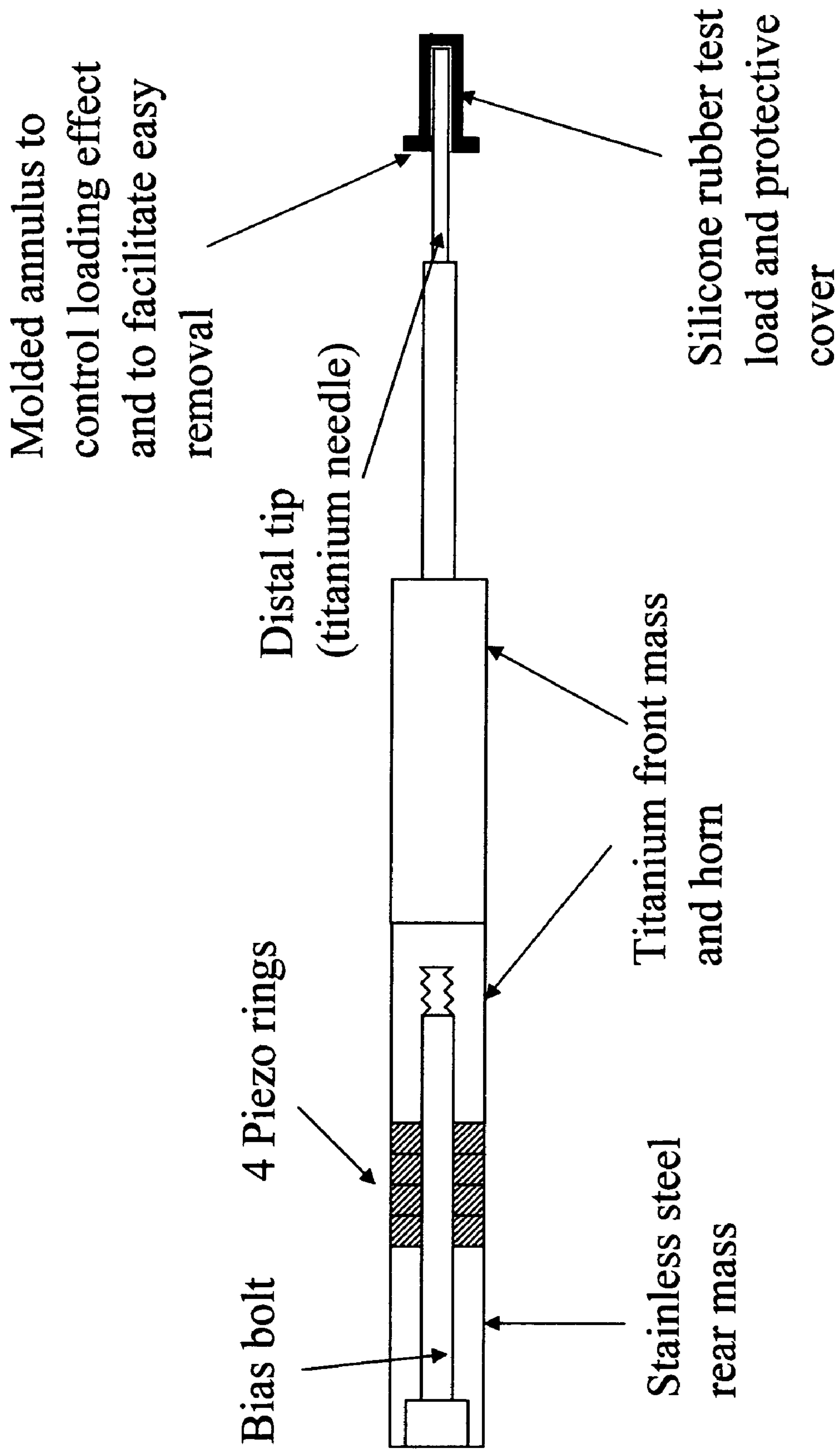
FIG. 13 is an illustration of a test load attached to the needle on a horn coupled to a phacoemulsification transducer

One aspect of this invention is to attach an acoustic load at the tip of the end effector that will also functionally protect it from damage and protect operating room staff from accidental injury. The end effector is usually a single use component that is attached to the transducer. End effectors used in applications such as soft tissue aspiration, liposuction, and kidney stone fragmentation are generally cylindrical in shape at their distal tip. Single use transducers for these applications will have the end effector permanently attached. A tight fitting silicone rubber sleeve or boot over the end effector would protect it from damage and function as an acoustic load that could removed and discarded after the transducer has been characterized immediately prior to operational use. FIG. 13 illustrates a test or acoustic load attached to the needle of a phacoemulsification transducer.

If necessary, the loading effect of the silicone rubber load can be varied and controlled by the addition of tungsten or other metal powder. The size of the molded annulus can also be varied to adjust the loading effect. The annulus is also required to facilitate easy removal of the test load/protective cover immediately after the transducer has been characterized and before operational use.

Prior to use and with the test load attached, the transducer can be characterized by applying a constant voltage and sweeping the frequency from a frequency below resonance to a frequency above anti-resonance. In prior art control algorithms, the voltage current and phase angle are measured at convenient increments. At each increment power is calculated by multiplying the modulus of current by the voltage and the cosine of the phase angle $\theta$. This potentially time consuming method depends on the required accuracy of the value of maximum power.

Figure 14:
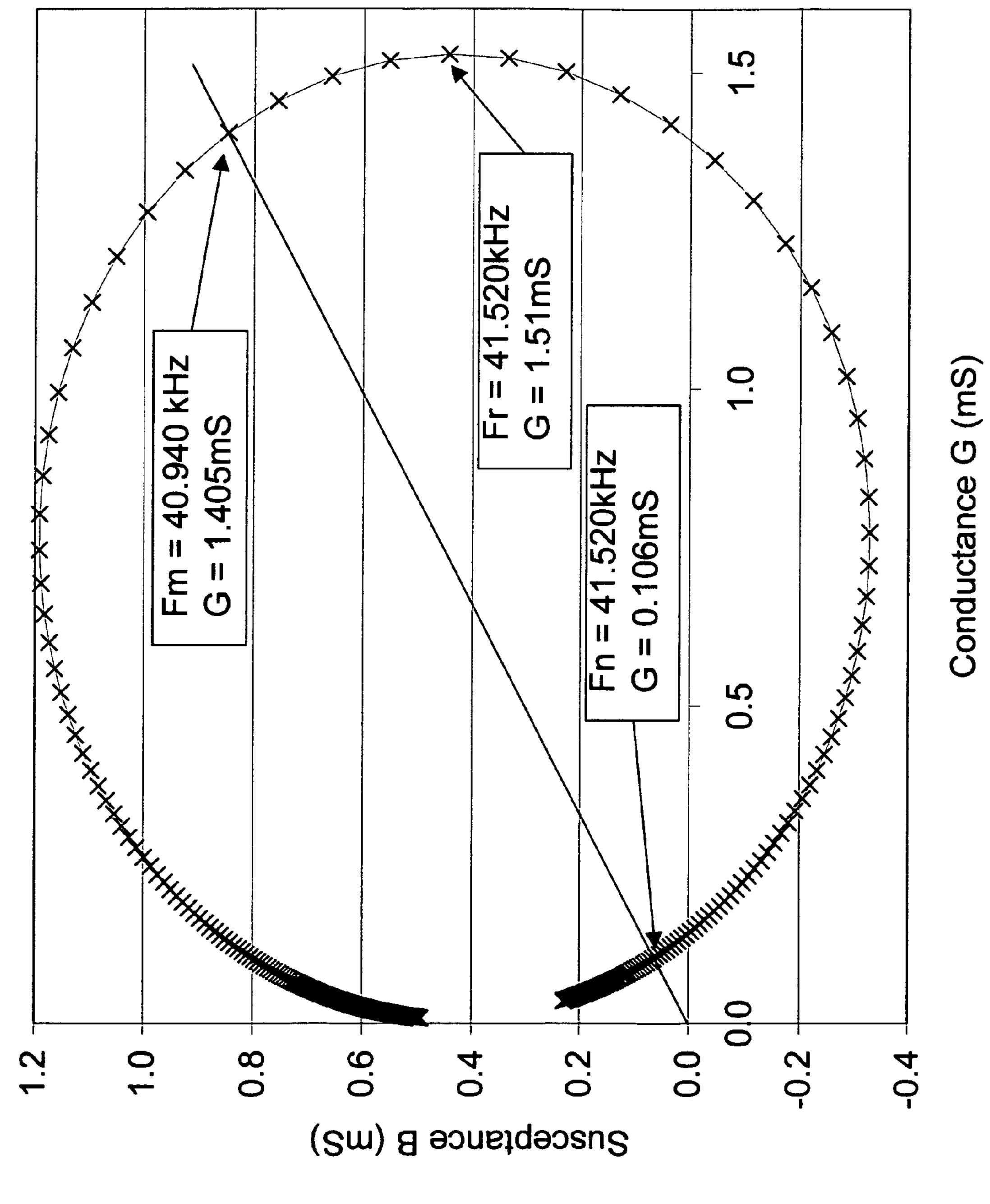
FIG. 14 is a circular plot of conductance versus susceptance for a transducer.

In this embodiment, an improved method for characterizing the transducer is provided. In this method, the traditional frequency versus impedance and phase plot is replace by an admittance plot. The value of admittance is one divided by the value of impedance and the real and imaginary components can be plotted as a conductance versus susceptance circle diagram as shown in FIG. 14. The frequency is incremented in a clockwise direction around the loop. At the motional resonance frequency (Fr) the conductance, power, and end effector velocity will reach a maximum value.

The maximum admittance frequency is denoted on the admittance loop as $F_m$ and the minimum admittance frequency is denoted as $F_n$. By observation, the value of the admittance at $F_m$ minus the value of the admittance at $F_n$ is equal to the diameter of the circle. The frequency of maximum velocity coincides with the maximum value of conductance that also has an in-phase real component of current that is equal to the diameter of the circle. Thus, the maximum power can be determined by sweeping the frequency over the resonant characteristic of the transducer at constant voltage, determining the maximum and minimum value of the current modulus, subtracting the minimum value of the current modulus from the maximum value of the current modulus, and multiplying the result of the subtraction by the applied constant voltage.

The foregoing examples illustrate various aspects of the invention and practice of the methods of the invention. The examples are not intended to provide an exhaustive description of the many different embodiments of the invention. Thus, although the foregoing invention has been described in some detail by way of illustration and example for purposes of clarity and understanding, those of ordinary skill in the art will realize readily that many changes and modifications can be made thereto without departing form the spirit or scope of the invention.

What is claimed is:

1. A method of velocity control comprising a) determining a non-motional clamped characteristic of a piezoelectric transducer at two predetermined frequencies, one below and one above a resonance frequency of the transducer;

b) determining a correction factor based on the non-motional clamped characteristic at the two predetermined frequencies; and c) applying the correction factor to generator output currents to maintain a specified value of end effector velocity.

2. The method of claim 1, wherein the correction factor is proportional to an effective coupling coefficient of the transducer.

3. The method of claim 1, wherein the non-motional clamped characteristic is current.

4. The method of claim 1, wherein the non-motional clamped characteristic is current, impedance, admittance, reactance, susceptance or capacitance.

5. The method of claim 4, wherein a constant voltage is applied when determining the non-motional clamped characteristic of the transducer.

6. The method of claim 1, wherein a horn is coupled to the transducer.

7. The method of claim 6, wherein a wave-guide is coupled to the horn and comprises a member that is any number of half wavelength fractions long.

8. The method of claim 6, wherein an operative tool or end effector is coupled to the horn.

9. The method of claim 7 wherein an operative tool or end effector is coupled to the wave-guide.

10. The method of claim 1, further comprising detecting one or more secondary resonances.

11. The method of claim 10, wherein detecting said one or more secondary resonances is from measurement of a phase angle between an applied voltage and current that is greater than −89°.

12. The method of claim 1, further comprising determining a change in a primary resonance frequency of the transducer.

13. The method of claim 12, wherein said change is determined from a measurement of a phase angle between an applied voltage and current that is greater than −89°.

14. The method of claim 1, wherein steps a and b are repeated multiple times for different pairs of predetermined frequencies, one below and one above a resonance frequency of the transducer.

15. The method of claim 1, wherein an inductive tuning coil is electrically connected in parallel with an electrical connection to the transducer.

* * * * *